(12) United States Patent
Woll et al.

(10) Patent No.: US 12,222,394 B2
(45) Date of Patent: Feb. 11, 2025

(54) COST-EFFECTIVE YET STILL PRECISE ASCERTAINMENT OF THE DEGRADATION STATE OF A RECHARGEABLE BATTERY

(71) Applicant: Robert Bosch GmbH, Stuttgart (DE)

(72) Inventors: Christoph Woll, Gerlingen (DE); Andras Gabor Kupcsik, Boeblingen (DE); Christian Simonis, Leonberg (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 17/328,649

(22) Filed: May 24, 2021

(65) Prior Publication Data

US 2021/0382115 A1   Dec. 9, 2021

(30) Foreign Application Priority Data

Jun. 3, 2020   (DE) .......................... 102020206915.8

(51) Int. Cl.
*G01R 31/36*   (2020.01)
*G01R 31/367*   (2019.01)
(Continued)

(52) U.S. Cl.
CPC ....... *G01R 31/367* (2019.01); *G01R 31/3842* (2019.01); *G01R 31/392* (2019.01)

(58) Field of Classification Search
CPC .................. G01R 31/367; G01R 31/3842; G01R 31/392; G01R 31/374; H01M 10/425;
(Continued)

(56) References Cited

U.S. PATENT DOCUMENTS

2013/0311115 A1* 11/2013 Chaturvedi ........ G01R 31/3606
  702/63
2015/0303723 A1* 10/2015 Raghavan ............. H02J 7/0052
(Continued)

FOREIGN PATENT DOCUMENTS

CN       210120206 U   *   2/2020   ............. Y02E 60/10
EP       2852848 A1       4/2015
(Continued)

OTHER PUBLICATIONS

"Capacity-Fading Behavior Analysis for Early Detection of Unhealthy Li-Ion Batteries", Changyong Lee, IEEE Transactions on Industrial Electronics, vol. 68, No. 3, Mar. 2021, Date of publication Feb. 13, 2020—from IDS (Year: 2020).*

(Continued)

*Primary Examiner* — Catherine T. Rastovski
*Assistant Examiner* — Lal C Mang
(74) *Attorney, Agent, or Firm* — NORTON ROSE FULBRIGHT US LLP; Gerard A. Messina

(57) ABSTRACT

A method for ascertaining an approximation and/or a prognosis for the true degradation state of a rechargeable battery. The method includes: providing a time sequence of values of the degradation state ascertained using measuring technology for past points in time; providing a trained HMM, which indicates, as a function of the true degradation state, at which probability during the ascertainment using measuring technology which particular value of the degradation state is monitored, and at which probability the true degradation state is maintained for what length of time, and/or at which probability this true degradation state transitions to which worse degradation state in the next time step; from the monitored time sequence and the HMM, the most probable characteristic of the true degradation state in the past that is in agreement with the monitored time sequence is ascer- (Continued)

tained; the desired approximation and/or prognosis is evaluated based on the most probable characteristic.

8 Claims, 3 Drawing Sheets

(51) Int. Cl.
  *G01R 31/3842* (2019.01)
  *G01R 31/392* (2019.01)
(58) Field of Classification Search
  CPC .............. H01M 10/48; H01M 10/44; H01M 2010/4271; H01M 2220/20; B60L 2240/545; B60L 2240/547; B60L 2240/549; B60L 58/16; Y02E 60/10; Y02T 10/70
  See application file for complete search history.

(56) References Cited

U.S. PATENT DOCUMENTS

| | | | |
|---|---|---|---|
| 2016/0064957 A1* | 3/2016 | Card | H02J 7/007 |
| 2016/0161567 A1* | 6/2016 | Park | G01R 31/3679 |
| 2020/0009988 A1* | 1/2020 | Basler | H01M 10/48 |

FOREIGN PATENT DOCUMENTS

| | | | | |
|---|---|---|---|---|
| WO | WO-2006057468 A1 * | 6/2006 | | G01R 31/389 |
| WO | 2013173589 A1 | 11/2013 | | |

OTHER PUBLICATIONS

Capacity-Fading Behavior Analysis for Early Detection of Unhealthy Li-Ion Batteries, Changyong Lee, IEEE Transactions on Industrial Electronics, Date of first publication: Feb. 13, 2020; HTML version: https://ieeexplore.ieee.org/document/8998548 (Year: 2020).*

Capacity-Fading Behavior Analysis for Early Detection of Unhealthy Li-Ion Batteries, Changyong Lee, IEEE Transactions on Industrial Electronics, Date of first publication: Feb. 13, 2020; https://ieeexplore.ieee.org/stamp/stamp.jsp?tp=&arnumber=8998548 (Year: 2020).*

Publication Dates for Capacity-Fading Behavior Analysis for Early Detection of Unhealthy Li-Ion Batteries, IEEE Xplore Resources and Help; https://ieeexplore.ieee.org/Xplorehelp/ieee-xplore-training/working-with-documents#publication-dates (Year: 2020).*

Lee, et al.: "Capacity-Fading Behavior Analysis for Early Detection of Unhealthy Li-Ion Batteries", IEEE Transactions on Industrial Electronics, 68 (3), (2021), pp. 2659-2666, XP011821816.

Lin, et al.: "Evaluation of Lithium Batteries Based on Continuous Hidden Markov Model", 2017 IEEE International Conference on Software Quality, Reliability and Security (Companion Volume), pp. 221-225, XP033139481.

Piao, et al.: "Analysis of Real-Time Estimation Method Based on Hidden Markov Models for Battery System States of Health", Journal of Power Electronics, 16 (1), (2016), pp. 217-226, XP055853846.

Pattipati, et al.: "System Identification and Estimation Framework for Pivotal Automotive Battery Management System Characteristics," IEEE Transactions on Systems, Man, and Cybernetics—Part C: Applications & Reviews, 41 (6), (2011), pp. 869-884.

\* cited by examiner

COST-EFFECTIVE YET STILL PRECISE ASCERTAINMENT OF THE DEGRADATION STATE OF A RECHARGEABLE BATTERY

CROSS REFERENCE

The present application claims the benefit under 35 U.S.C. § 119 of German Patent Application No. DE 102020206915.8 filed on Jun. 3, 2020, which is expressly incorporated herein by reference in its entirety.

FIELD

The present invention relates to monitoring and predicting the degradation state of rechargeable batteries, in particular for at least partly electrically driven vehicles.

BACKGROUND INFORMATION

During charging, rechargeable batteries convert electrical energy from an external supply into chemical energy. In the discharging process, the chemical energy is conversely converted into electrical energy, which feeds an external consumer. In particular in the case of traction batteries in at least partly electrically driven vehicles such as purely battery-electrical vehicles or hybrid vehicles, a considerable portion of the stored energy is withdrawn on a regular basis, and this portion is later recharged again.

Current electrochemical batteries are subject to a degradation process. The utilizable capacitance drops with increasing service life, and in particular with an increasing number of completed charge and discharge cycles. Among other things, this ageing process depends on the use profile and on the operating conditions. For example, battery-driven smartphones offer excellent service over many years in the hands of some users, whereas the battery shows signs of wear in the hands of other users and is the first component to fail.

European Patent No. EP 2 852 848 B1 describes a method for determining kinetic parameters of a model of a battery. A degradation state, SOH (state of health), can be determined on the basis of this model.

SUMMARY

Within the framework of the present invention, a method for ascertaining an approximation and/or a prognosis of the true degradation state of a rechargeable battery is provided.

In accordance with an example embodiment of the present invention, in the method, a time sequence, discretized into predefined time steps, of values of the degradation state ascertained for instants in the past with the aid of measuring technology is provided.

An 'ascertainment using measuring technology' refers to any acquisition of measured values with a subsequent evaluation that supplies a measure of the degradation state. The degradation state as an approximation is able to be determined in a wide variety of ways. A sensor which directly supplies the value of the degradation state is therefore not required.

For example, the monitored values of the degradation state are able to be determined based on a charge quantity that is output to the battery during charging of the battery from a first clamping voltage to a second, higher clamping voltage. For example, typical battery cells for traction batteries of vehicles are able to be charged starting from a clamping voltage of 3V to their end-of-charge voltage of 4.2V. With the aid of "Coulomb counting" such as by an integration of the current flowing into the battery, it is then possible to ascertain the charge quantity supplied to the battery. The more charge the battery is able to absorb, the greater its still utilizable capacitance, and the better its degradation state.

In accordance with an example embodiment of the present invention, the monitored values of the degradation state are ascertained on the basis of a time period during which the clamping voltage of the battery drops from a first value to a second, lower value under loading by a predefined load. The longer the clamping voltage remains above the second, lower value, the greater the capacitance from which it feeds the load and the better its degradation state.

For example, while the battery is being discharged, time sequences of the clamping voltage, the discharge current as well as the charge state of the battery are also able to be acquired. The monitored values of the degradation state may then be ascertained from these time sequences with the aid of a physical model of the degradation state. Especially a temperature inside the battery may then be detected in addition during the discharge process and this temperature can then be taken into account in the physical model. The mentioned variables are regularly available, in particular on board an at least partly electrically driven vehicle.

The methods described herein by way of example as well as all other methods for the approximate determination of the degradation state are limited in terms of the accuracy of the ascertained approximation by the accuracy with which the respectively used measured values are able to be acquired. However, especially the measuring instruments installed on board of vehicles are typically configured more for short-term monitoring of the operating state of the electrical system from moment to moment rather than for long-term monitoring of the degradation state. For the latter purpose, the measuring data are thus sometimes relatively uncertain and include noise. The use of higher-quality measuring instruments is expensive and still will not guarantee a random increase in accuracy because of the multitude of interference sources for measurements in the tight space of the electrical system of a vehicle.

Within the framework of the present method in accordance with an example embodiment of the present invention, it is therefore provided to improve the accuracy with the aid of a trained Hidden Markov Model, HMM. An HMM makes it possible to supply probability statements about "hidden" variables that are not directly measurable on the basis of observations whose probabilities depend on the states of these "hidden" variables. In the present application, the hidden variable about which information is to be obtained is the true degradation state of the battery, and the values of the degradation state, ascertained using measuring technology, represent the observations.

In this context, the analysis is basically time-discrete using predefined time steps. More specifically, the raster of these time steps may be congruent with the raster of the particular time steps in which the values of the degradation state, ascertained using measuring technology, are also discretized. However, this is not mandatory. The degradation state itself is also discretized, e.g., in percentages of 100% for a new battery and down to 70% for a battery which is due for an exchange.

The trained HMM indicates as a function of the true degradation state at which probability which particular value of the degradation state is monitored during the ascertainment with the aid of measuring technology. These probabilities may establish what is known as a "monitoring matrix", for instance. The more simplifying the physical model used for the ascertainment via measuring technology and the more uncertain the used measured values, the more the values of the degradation state ascertained using measuring technology are scattered around the true degradation state. In particular, prior knowledge about the physical model used for ascertaining the degradation state with the aid of measuring technology and about the uncertainty of the used measured values may thus be reflected in the monitoring matrix.

In addition, the trained HMM indicates as a function of each true degradation state at which probability this true degradation state transitions to which worse degradation state in the next time step. As an alternative or also in combination therewith, the trained HMM is able to indicate, e.g., in the form of a distribution, at which probability the true degradation state will be maintained and for what length of time. These probabilities are able to form a "transition matrix", for example. Thus, the dynamics of the degradation may manifest themselves in the transition matrix. In addition, prior knowledge of the mentioned model may be embodied therein and also, for instance, the marginal condition that the degradation is irreversible and progresses monotonically. In other words, good treatment makes it possible to maximally maintain the current degradation state of the battery, but the battery will not recuperate from an already sustained degradation.

In accordance with an example embodiment of the present invention, based on the monitored time sequence of values of the degradation state ascertained by measuring technology, and based on the HMM, the most likely characteristic of the true degradation state in the past that conforms to the monitored time sequence is ascertained. From this most likely characteristic, the desired approximation is evaluated. Alternatively or also in combination therewith, the updating of the mentioned most probable characteristic of the degradation state is also able to provide a prognosis of the degradation state for the future. To some degree, this task is comparable to the error correction during the readout of data carriers in which one or another bit may already have "flipped". Therefore, the most probable characteristic of the true degradation state is able to be ascertained in particular using the Viterbi algorithm, which is also used for an error correction, for example.

Prior to applying the HMM, the time sequence of the monitored values of the degradation state is optionally able to be smoothed, filtered or preprocessed in some other manner.

It was understood that the utilization of the HMM makes it possible to limit not only the effect of inaccuracies of the used physical model and also uncertainties of the measured values but that the present method also supplies information as to whether the battery is likely to be treated well under the current operating conditions and will function for a long time or whether it is used by a "battery abuser" who wears it down. Thus, if a prognosis for the true degradation state ascertained for a future point in time satisfies a predefined criterion, for instance, the time period up to this future instant may be considered the remaining utilizable service life of the battery.

Especially in the case of traction batteries in vehicles, there are many possibilities for slowing, impeding but also for accelerating the degradation. For example, it is not optimal for the battery to be subjected to a deep discharge on a frequent basis or to withdraw high currents from the battery at high temperatures.

For that reason, for instance, it is possible that the degradation state of batteries in a fleet of electrically driven vehicles has a very inhomogeneous distribution, even with comparable driving outputs. A prognosis for the future allows the traction battery to be exchanged at precisely the time when such an exchange is actually required. Since the traction battery may be the most expensive part in an electrically driven vehicle, an exchange that occurs too early is expensive. A late exchange, on the other hand, may cause the vehicle to fail and require an expensive towing operation. At the present time, no exchange of the traction battery on the road with the aid of a roadside assistance service is provided yet.

As described above, the uncertainty of the degradation state of the battery, ascertained using measuring technology, depends especially on the uncertainties of the used measuring values and the physical model. The physical model decides about the propagation of the individual uncertainties of the measuring values to the overall uncertainty of the ascertained degradation state. This may already be taken into account when the HMM is trained for use in the previously described method. As a result, the present invention also provides a method for training an HMM for this use.

In this method, time sequences of the characteristic of the true degradation state of a multitude of batteries during their use are supplied. For instance, these time sequences are able to be recorded on board the electrically driven vehicles and be transmitted live to a Cloud or be read out at regular intervals in a workshop. For example, the true degradation state may be ascertained with the aid of measuring technology, in particular, such as in a laboratory under optimal conditions. A sensor which directly supplies the value of the degradation state is not required for this purpose; a measurement of the capacitance loss of the battery, for example, is sufficient. For instance, batteries are able to be measured at certain intervals in test vehicles or within the framework of a simulated use.

This expenditure for training the HMM needs to be invested only a single time. In the mass production, this HMM will then prove useful in many ways.

As a result, a physical model which maps measured values of at least the clamping voltage, the discharge current as well as the charge state of the battery to a value of the degradation state is able to be provided within the framework of the present method.

In accordance with an example embodiment of the present invention, utilizing measuring-technology related uncertainties inherent in the measurement of the measured values used by the physical model, it is ascertained as a function of the true degradation state at which probability which particular value of the degradation state is monitored when ascertaining the measured value with the aid of measuring technology and while utilizing the physical model. On this basis, the previously mentioned monitoring matrix is able to be developed.

Utilizing the characteristic of the true degradation state, it is ascertained at which probability this true degradation state will be maintained and for what length of time, and/or at which probability this true degradation state transitions to which worse degradation state in the next time step.

These probabilities are dependent on the current degradation state, but also on the current loading of the battery by the already mentioned as well as additional stress factors that have an adverse effect on the service life of the battery. Thus, in addition to the true degradation state of the battery, these stress factors may also be considered further "hidden" variables of the HMM. The current state of the HMM is then no longer characterized only by the true degradation state but also by the stress factors. From zero different transition probabilities, it is therefore possible to particularly indicate intermediate states that are characterized by different true degradation states but identical stress factors. For many different constellations of stress factors, it is therefore possible to collect respective information of how rapidly the degradation progresses if these stress factors are maintained, and to compile the information in the previously mentioned transition matrix over the course of the training. Therefore, the previously mentioned ascertainment of the most probable characteristic of the true degradation state will then supply not only this true degradation state itself but also the respective encountered stress factors. It may then perhaps be possible to isolate or possibly even precisely ascertain what exactly has led to the observed degradation so that operating errors, for instance, can be avoided in the future.

As previously described, the physical model may make the degradation state additionally dependent on at least a temperature inside the battery.

In particular, the present methods in accordance with example embodiments of the present invention are able to be implemented entirely or partially in software. For this reason, the invention also relates to a computer program having machine-readable instructions which, when executed on a computer or on multiple computers, induce the computer(s) to execute one of the described methods. A download product is a digital product which is transmittable via a data network, i.e. is downloadable by a user of the data network, and offered for an immediate download by an online shop, for instance.

In addition, a computer may be equipped with the computer program, with the machine-readable data carrier or with the download product.

Additional measures which improve the present invention will be illustrated in greater detail in the following text together with the description of the preferred exemplary embodiments of the present invention.

DETAILED DESCRIPTION OF EXAMPLE EMBODIMENTS

Figure 1:
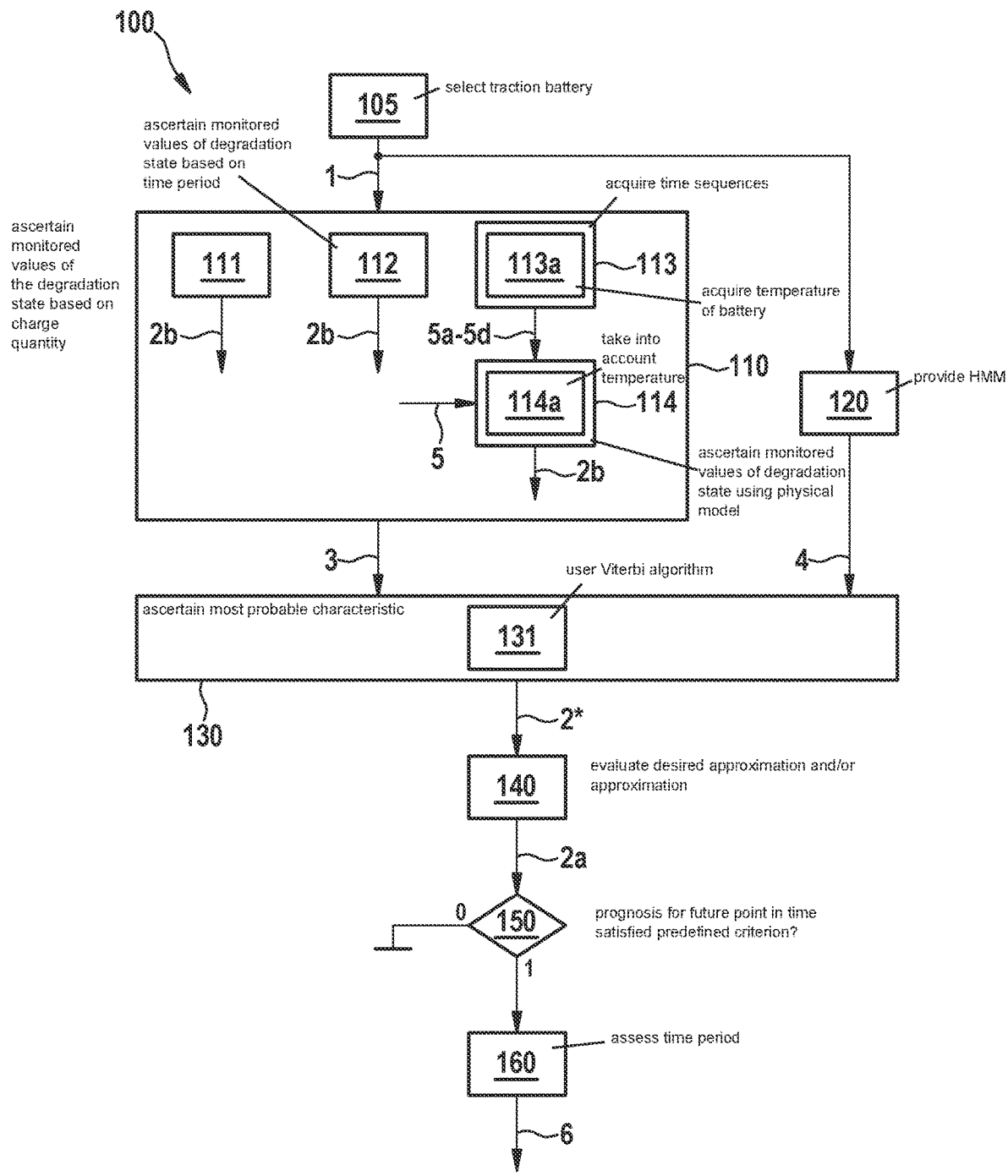
FIG. 1 shows an exemplary embodiment of method 100 for ascertaining an approximation and/or prognosis 2a of the degradation of a battery 1, in accordance with the present invention.

FIG. 1 is a schematic flow diagram of an exemplary embodiment of method 100, in accordance with the present invention. In step 105, a traction battery of an at least partly electrically driven vehicle 1 is selected.

In step 110, a time sequence 3 is provided, which is discretized by predefined time steps, of values 2b of the degradation state ascertained with the aid of measuring technology for points in time in the past. In step 120, an HMM 4 is provided, which sets the true degradation state 2 and optionally also the stress factors that are affecting this degradation state but are not directly measurable, in relation to the probability that certain values 2b of the degradation are monitored and/or that true degradation state 2 changes in a certain way. On this basis, the most probable characteristic 2* of true degradation state 2 in the past that agrees with monitored time sequence 3, is ascertained in step 130. In this context, a Viterbi algorithm is able to be used, especially according to block 131.

In step 140, the desired approximation and/or prognosis 2a is evaluated from the most probable characteristic 2*. If prognosis 2a for a future point in time satisfies a predefined criterion 150 (truth value 1), then the time period up to this future point in time is assessed as remaining usable service life 6 of battery 1 in step 160.

A number of exemplary possibilities with regard to the manner in which time sequence 3 of values 2b of the degradation ascertained by measuring technology is able to be ascertained are indicated in box 110.

According to block 111, monitored values 2b of the degradation state are able to be ascertained based on a charge quantity that is output to battery 1 when battery 1 is charged from a first clamping voltage to a second, higher clamping voltage.

According to block 112, monitored values 2b of the degradation state are able to be ascertained based on a time period in which the clamping voltage of battery 1 drops from a first value to a second, lower value under loading by a predefined load.

According to block 113, the time sequences of clamping voltage 5a, of discharge current 5b as well as charge state 5c of battery 1 are able to be acquired during the discharging of battery 1. According to block 113a, it is also possible to acquire a temperature 5d of battery 1.

According to block 114, monitored values 2b of the degradation state are able to be ascertained with the aid of a physical model 5 of the degradation state from the time sequences of measuring variables 5a-5c. According to block 114a, temperature 5d is additionally able to be taken into account in this context.

Figure 2:
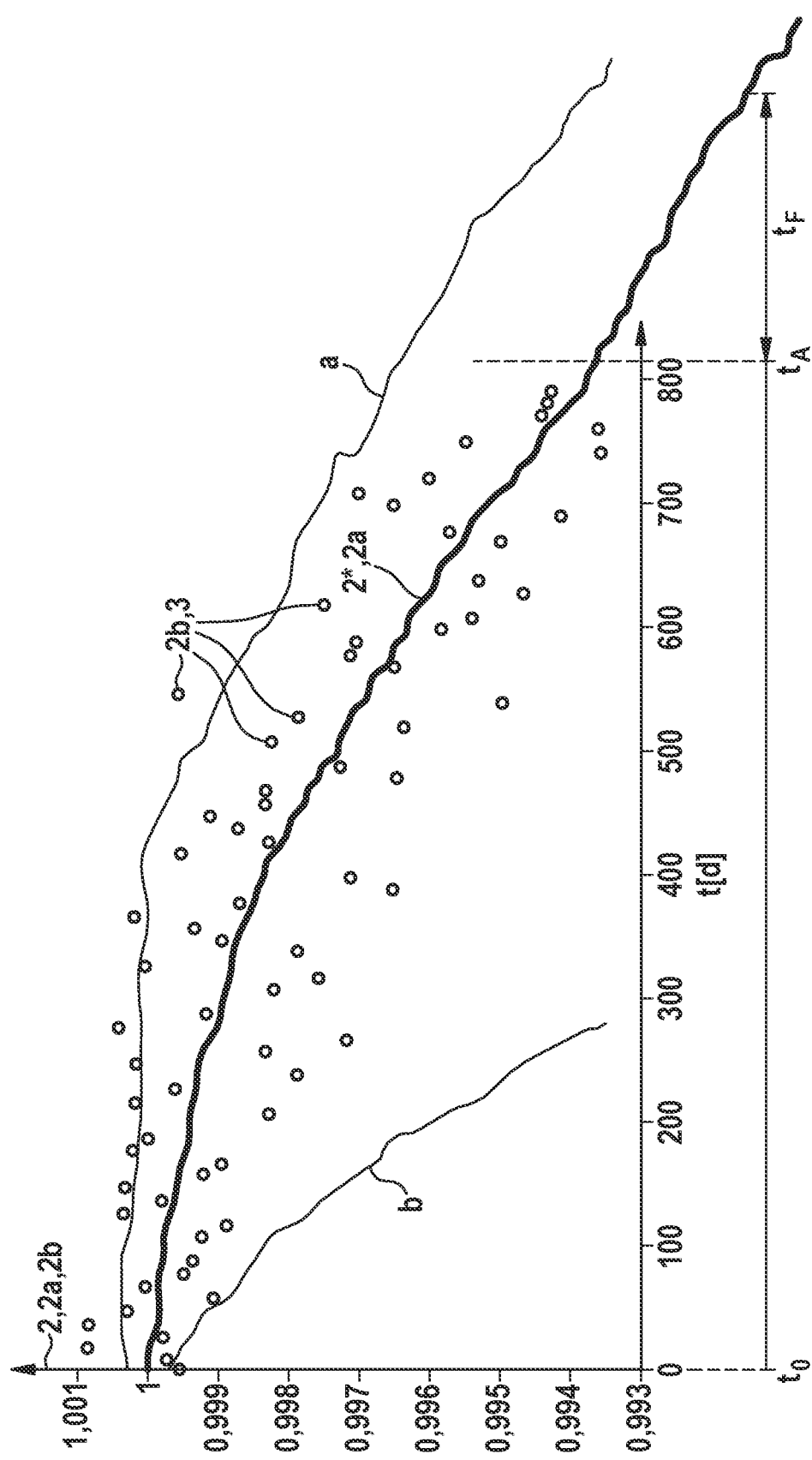
FIG. 2 shows an exemplary, most probable characteristic 2* of true degradation 2 based on given monitoring 2b of the degradation in terms of measuring technology, in accordance with the present invention.

FIG. 2 exemplarily illustrates the manner in which the most probable characteristic 2* of true degradation 2 is able to be ascertained starting from a time sequence 3 of values 2b of the degradation of battery 1 monitored with the aid of measuring technology.

Curve a sketched by way of example represents a time characteristic of the degradation which corresponds to only slow ageing of battery 1. This time characteristic is in agreement only with a few values 2b of time sequence 3 and thus is less plausible.

Curve b sketched by way of example represents a time characteristic of the degradation that corresponds to very rapid ageing of battery 1. This time characteristic, too, is in agreement with only a few values 2b of time sequence 3 and thus is likewise less plausible.

The greatest agreement with the available monitored values 2b exists for characteristic 2* of true degradation 2 ascertained based on HMM4. This characteristic 2* delivers an approximation 2a for true degradation 2 not only for any time in the past starting from the initial operation of battery 1 at time to up to current point in time $t_A$, but this approximation 2a also seamlessly transitions to a prognosis for future times $t_F$ beyond current time $t_A$.

Figure 3:
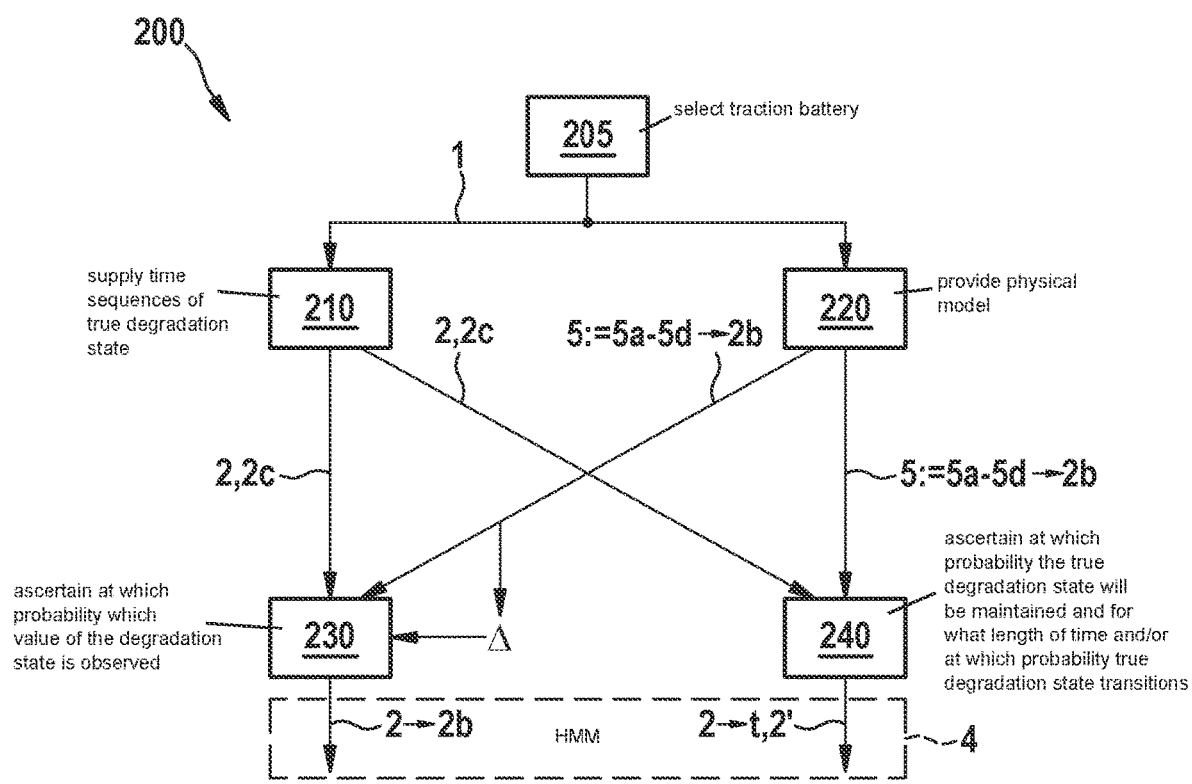
FIG. 3 show an exemplary embodiment of method 200 for training an HMM 4 for use in method 100, in accordance with the present invention.

FIG. 3 shows an exemplary embodiment of method 200 for training HMM 4. Similar to step 105 in FIG. 1, a traction battery of a vehicle is selected as battery 1 in step 205.

In step 210, time sequences 2c of true degradation state 2 are supplied for a multitude of batteries of this type. In step 220, a physical model 5 is provided, which maps measured values of at least clamping voltage 5a, discharge current 5b as well as charge state 5c of battery 1 to a value 2b of the degradation state.

In step 230, utilizing measuring-technology related uncertainties Δ inherent in the measurement of these measured values 5a-5c, it is ascertained as a function of true degradation state 2 at which probability which value 2b of the degradation state is observed in the ascertainment of the measured values using measuring technology and utilizing the physical model.

In step 240, utilizing the characteristic of true degradation state 2, it is ascertained at which probability this true degradation state 2 will be maintained and for what length of time t, and/or at which probability this true degradation state transitions to which worse degradation state 2' in the next time step.

The information ascertained in steps 230 and 240 characterizes the HMM 4.

What is claimed is:

1. A method for ascertaining an approximation and/or a prognosis for a true degradation state of a rechargeable battery of an at least partly electrically driven vehicle, the method comprising the following steps:
   providing a time sequence, discretized into predefined time steps, of values of a degradation state ascertained using measuring technology, for points in time in the past;
   providing a trained Hidden Markov Model (HMM), which indicates as a function of the true degradation state:
      at which probability which particular value of the degradation state is monitored during the ascertainment using the measuring technology, and
      at which probability the true degradation state is maintained for what length of time, and/or at which probability the true degradation state transitions to which worse degradation state in a next time step;
   ascertaining, from the provided time sequence and the HMM, a most probable characteristic of the true degradation state in the past that is in agreement with the provided time sequence, wherein:
   the approximation and/or prognosis is based on the most probable characteristic,
   during discharging of the battery, time sequences of a clamping voltage, a discharge current, and a charge state of the battery are acquired, and the values of the degradation state are ascertained from the time sequences of the clamping voltage using a physical model of the degradation state, and
   the physical model and the HMM are different from each other, wherein the most probable characteristic of the true degradation state in at least one past point in time that is in agreement with the provided time sequence is updated using a Viterbi algorithm, and wherein the approximation and/or prognosis is based on the most probable characteristic of the true degradation in the at least one past point in time that is in agreement with the provided time sequence.

2. The method as recited in claim 1, wherein the values of the degradation state are ascertained based on a charge quantity that is output to the battery when charging the battery from a first clamping voltage to a second, higher clamping voltage.

3. The method as recited in claim 1, wherein the values of the degradation state are ascertained based on a time period during which a clamping voltage of the battery drops from a first value to a second, lower value under loading by a predefined load.

4. The method as recited in claim 1, wherein a time sequence of at least a temperature in the battery is acquired during the discharging and the temperature is taken into account in the physical model.

5. The method as recited in claim 1, wherein when a prognosis ascertained for a future point in time for the true degradation state satisfies a predefined criterion, a time period up to the future point in time is considered a remaining usable service life of the battery.

6. The method as recited in claim 1, wherein a traction battery of an at least partly electrically driven vehicle is selected as the battery.

7. A non-transitory machine-readable data carrier on which is stored a computer program for ascertaining an approximation and/or a prognosis for a true degradation state of a rechargeable battery of an least partly electrically driven vehicle, the computer program, when executed by one or more computers, causing the one or more computers to perform the following steps:
   providing a time sequence, discretized into predefined time steps, of values of a degradation state ascertained using measuring technology, for points in time in the past;
   providing a trained Hidden Markov Model (HMM), which indicates as a function of the true degradation state:
      at which probability which particular value of the degradation state is monitored during the ascertainment using the measuring technology, and
      at which probability the true degradation state is maintained for what length of time, and/or at which probability the true degradation state transitions to which worse degradation state in a next time step;
   ascertaining, from the provided time sequence and the HMM, a most probable characteristic of the true degradation state in the past that is in agreement with the provided time sequence, wherein:
   the approximation and/or prognosis is based on the most probable characteristic,
   during discharging of the battery, time sequences of a clamping voltage, a discharge current, and a charge state of the battery are acquired, and the values of the degradation state are ascertained from the time sequences of the clamping voltage using a physical model of the degradation state, and
   the physical model and the HMM are different from each other, wherein the most probable characteristic of the true degradation state in at least one past point in time that is in agreement with the provided time sequence is updated using a Viterbi algorithm, and wherein the approximation and/or prognosis is based on the most probable characteristic of the true degradation in the at least one past point in time that is in agreement with the provided time sequence.

8. A computer configured to ascertain an approximation and/or a prognosis for a true degradation state of a rechargeable battery, the computer configured to:
   provide a time sequence, discretized into predefined time steps, of values of a degradation state ascertained using measuring technology, for points in time in the past;
   provide a trained Hidden Markov Model (HMM), which indicates as a function of the true degradation state:

at which probability which particular value of the degradation state is monitored during the ascertainment using the measuring technology, and at which probability the true degradation state is maintained for what length of time, and/or at which probability the true degradation state transitions to which worse degradation state in a next time step;

ascertain, from the provided time sequence and the HMM, a most probable characteristic of the true degradation state in the past that is in agreement with the provided time sequence, wherein:

a desired approximation and/or prognosis is based on the most probable characteristic, during discharging of the battery, time sequences of a clamping voltage, a discharge current, and a charge state of the battery are acquired, and the values of the degradation state are ascertained from the time sequences of the clamping voltage using a physical model of the degradation state, and the physical model and the HMM are different from each other, wherein the most probable characteristic of the true degradation state in at least one past point in time that is in agreement with the provided time sequence is updated using a Viterbi algorithm, and wherein the approximation and/or prognosis is based on the most probable characteristic of the true degradation in the at least one past point in time that is in agreement with the provided time sequence.

\* \* \* \* \*